United States Patent [19]

Burrows

[11] Patent Number: 5,018,099

[45] Date of Patent: May 21, 1991

[54] COMPARISON CIRCUIT

[75] Inventor: James L. Burrows, Merrimack, N.H.

[73] Assignee: Lockheed Sanders, Inc., Nashua, N.H.

[21] Appl. No.: 461,901

[22] Filed: Jan. 8, 1990

[51] Int. Cl.$^5$ .............................................. G11C 15/00
[52] U.S. Cl. .................................... 365/49; 365/189.05
[58] Field of Search ...................... 365/45, 49, 230.03, 365/218, 189.07, 189.05

[56] References Cited

U.S. PATENT DOCUMENTS

| 4,799,192 | 1/1989 | Wade et al. | 365/49 |
| 4,823,313 | 4/1989 | Kadota | 365/49 |
| 4,845,668 | 7/1989 | Sano et al. | 365/49 |
| 4,879,687 | 11/1989 | Okamoto et al. | 365/49 X |

Primary Examiner—Joseph A. Popek
Attorney, Agent, or Firm—David W. Gomes; Richard A. Jordan

[57] ABSTRACT

A comparison circuit which is both window addressable and content addressable, the circuit including comparison elements which include a pair of match transistors which isolate outputs indicating whether an input is not greater than stored data and whether an input is not less than stored data from an output indicating whether an input is equal to stored data.

11 Claims, 2 Drawing Sheets

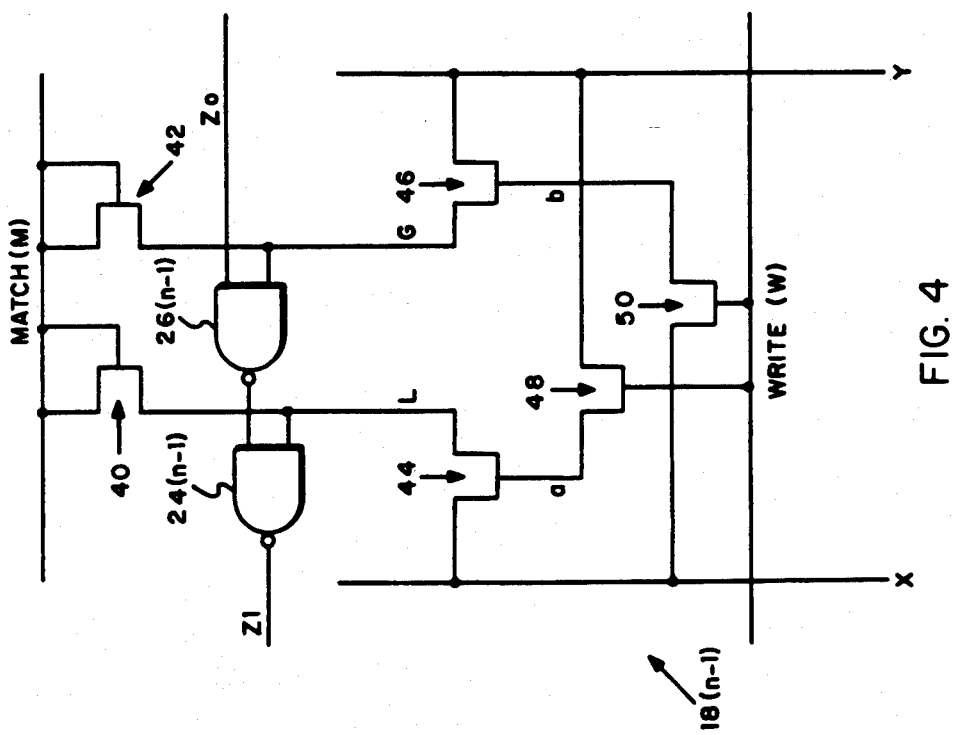

COMPARISON CIRCUIT

BACKGROUND OF THE INVENTION

The present invention relates to comparison circuits.

It is known to provide a window addressable memory (WAM) in which pairs of upper and lower limits of data (i.e., a window of data) are stored. This stored window may then be compared with an input data word; if the data word falls within the limits of the window, the WAM provides an output indicating the match. With known memories of this type, it is necessary to use the entire window to express the limits necessary to detect an exact match or a single limit (i.e., a threshold). A memory which detects an exact match is referred to as a content addressable memory (CAM).

SUMMARY OF THE INVENTION

The invention provides a new and improved window addressable memory.

In brief summary, the new window addressable memory includes a circuit that determines selected value relationships between a stored digital data word and an input data word comprising a word storage device and a logic chain. The word storage device comprises a series of stages each including a memory element that stores a digital data bit, the bits stored in the series of stages defining the stored digital data word, and a comparator. The comparator is responsive to the stored digital data bit and an input digital data bit, the input digital data bits received by the comparators of the series of stages defining the input data word, and transmits through respective output terminals signals indicating the relationship between the values of the stored digital data bit and the input digital signal. The logic chain is connected to said output terminals that generates a signal indicating the relationship between the stored digital data word and the input digital data word.

It has been discovered that providing first and second pass transistors connected to receive first and second inputs, respectively, and to provide first and second outputs, respectively, first and second cross-over transistors connected to the first and second pass transistors, respectively, the first and second cross-over transistors being connected to the second and first inputs, respectively, the pass transistors and the cross-over transistors being configured to store data at the junctions between the pass transistors and the cross-over transistors, the first and second match transistors also being connected to a third output, the first and second match transistors individually isolating the first and second outputs from the third output, advantageously provides a comparison element which provides outputs which indicate whether an applied bit is greater than, less than or equal to a stored bit.

It has also been discovered that such a comparison element may be used to provide a circuit which is both window addressable and content addressable.

BRIEF DESCRIPTION OF THE DRAWINGS

The invention is pointed out with particularity in the appended claims. The advantages of the invention may be better understood by referring to the following description taken in conjunction with the accompanying drawings, in which:

FIG. 4 is a schematic diagram of an element of the FIG. 1 comparison circuit; and, FIGS. 5 and 6 are tables which are useful in understanding the operation of the FIG. 4 element.

FIG. 7 is a table which is useful in understanding an element of the FIG. 1 comparison circuit.

DESCRIPTION OF THE PREFERRED EMBODIMENT

Figure 1:
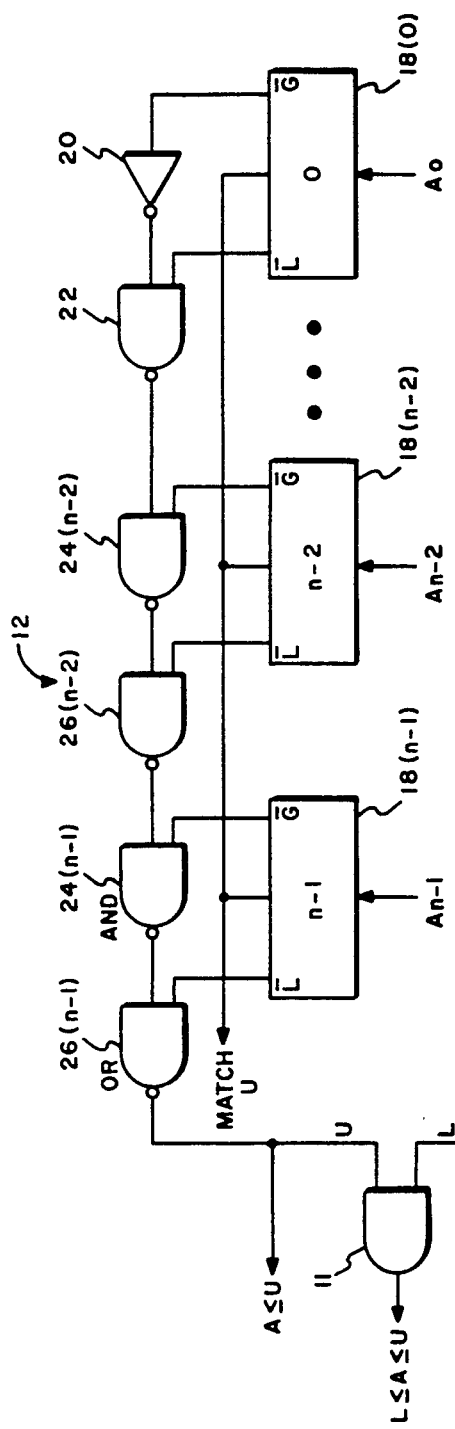
FIG. 1 is a schematic diagram of a comparison circuit in accordance with the present invention.
Figure 1:
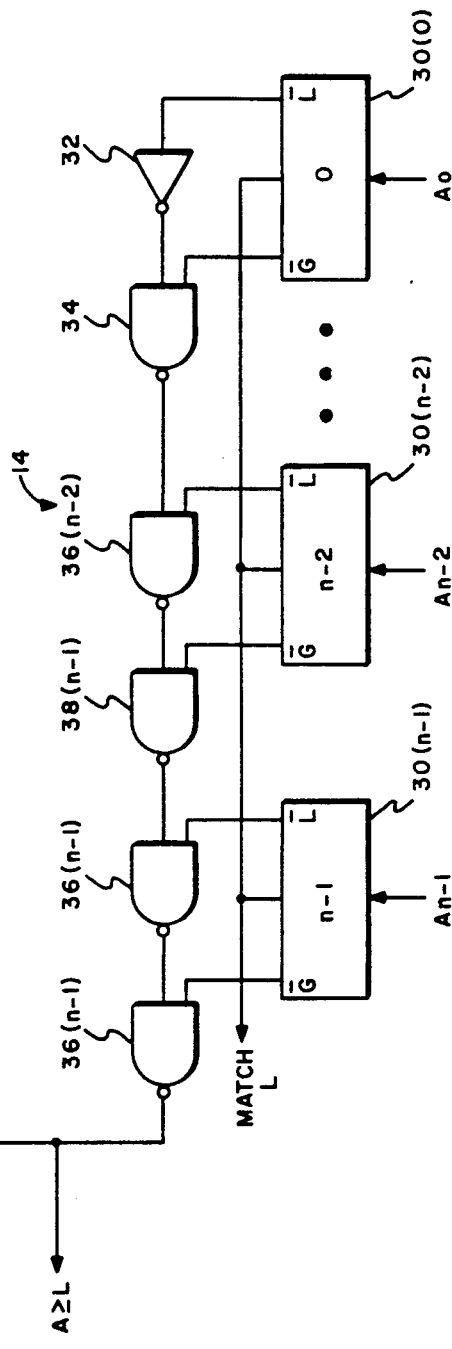

Referring to FIG. 1, comparison circuit 10 provides five output signals; two single limit thresholds ($A \leq U$, $A \geq L$); one between limits window ($L \leq A \geq U$); and, two exact matches (MATCH U, MATCH L). "Input word A" designates the word being compared and "upper bound U" and "lower bound L" designate the word to which "A" input word is compared. Comparison circuit 10 includes upper threshold chain 12 and lower threshold chain 14 which each provide an output to AND gate 16.

Upper threshold chain 12 includes upper threshold memory elements 18 (n−1) through 18 (0) (generally identified by reference numeral 18) in which respective bits of upper bound $U_{n-1} - U_0$ are stored; each memory element 18 provides a match output signal (MATCH U), a not less than output signal (L') and a not greater than output signal (G'). In memory element 18 (0), the G' output signal is passed through inverter 20 to NAND gate 22, to which the not less than output is also provided. The output of NAND gate 22 is provided to NAND gate 24 (n−2), to which the output of the next stage memory element (A(n−2)) is also applied. The output of NAND gate 24 (n−2) is provided to NAND gate 26 (n−2), to which the L' output is also provided. Each subsequent stage includes a memory element and two NAND gates (generally identified by reference numerals 24 and 26).

Lower threshold chain 14 includes lower threshold memory elements 30 (N−1) through 30 (0) (generally identified by reference numeral 30) in which respective bits of lower bound $L_{n-1} - L_0$ are stored; each memory element 30 provides a match output (MATCH L) signal, a not less than output (L') signal and a not greater than output G') signal. Memory elements 30 correspond to memory elements 18 except that the G' and L' outputs are reversed. In memory element 30 (0), the L' output signal is passed through inverter 32 to NAND gate 34, to which the G' output signal is also provided. The output signal of NAND gate 36 is provided to NAND gate 38, to which the L' output signal of the next stage memory element (30(n−2)) is also applied. The output of NAND gate 36 is provided to NAND gate 38, to which the G' output is also provided. Each subsequent stage includes a memory element and two NAND gates.

Referring to FIG. 4, threshold memory element 18 with corresponding NAND gates 24, 26 is shown. Memory element 18 includes a pair of load transistors 40, 42, a pair of match transistors 44, 46 and a pair of write control transistors 48, 50. Element !8 receives the inputs X, Y and write (W) and provides the outputs L', G' and match (M).

The gate and drain terminals of load transistors 40, 42 are connected to the precharged M output line; the source terminals of load transistors 40, 42 are connected to the source terminal of match transistor 44 and the drain terminal of match transistor 46, respectively.

These terminals provide the L' and G' output signals which are applied to NAND gates 24, 26, respectively. The drain terminal of match transistor 44 is connected to input terminal X, which is also connected to the drain terminal of write control transistor 50. The source terminal of match transistor 46 is connected to input terminal Y, which is also connected to the source terminal of write control transistor 48. The gate terminal of match transistor 44 is connected to the drain terminal of write control transistor 48. The gate terminal of match transistor 46 is connected to the source terminal of write control transistor 50. The gate terminals of write control transistors 48, 50 are connected to the W input line.

Figure 2:
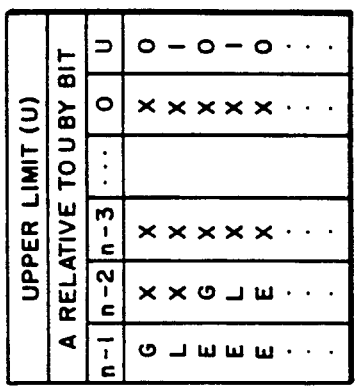
FIGS. 2 and 3 are tables which are useful in understanding the operation of the FIG. 1 comparison circuit.
Figure 3:
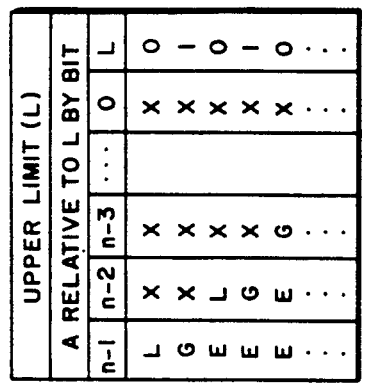

Referring to FIGS. 1-3, in operation of comparison circuit 10, input word A is compared to upper bound U and lower bound U. More specifically, each memory element 18 compares a bit of input word A with a respective bit of upper bound U, which is stored in a respective memory element 18. Each memory element 18 determines whether the bit of input word A is greater than, less than, or equal to upper bound U (designated G, L and E in FIG. 2). Additionally, each memory element 30 compares a bit of input word A with a respective bit of lower bound L, which is stored in a respective memory element 30. Each memory element 30 describes whether the bit of input word A is greater than, less than, or equal to lower bound U, (designated G, L, and E in FIG. 3). An understanding of the operation of memory elements 18, 30 is necessary for an understanding of the operation of comparison circuit 10.

The condition of a bit of input word A being greater than a bit of upper bound U will now be described. When the most significant bit of input word A ($A_{n-1}$) is greater than the most significant bit of upper bound U ($U_{n-1}$), which is stored in the n−1 upper limit memory element 18, the A≦U output of upper threshold chain 12 is low.

Referring to FIGS. 4-6, memory element 18 may store a high, low or don't care (designated by the WRITE 1, WRITE 0 and WRITE X portions of FIG. 5).

Referring now to the WRITE 0 portion of FIG. 5, a WRITE 0 operation will first be described, followed by descriptions of a MATCH 1 operation and a MATCH 0 operation.

The WRITE 0 operation describes the operation to store a low in element 18. Referring to FIG. 5, for a WRITE 0, a high is provided on the X input, a low is provided on the Y input and a high is provided on the W input. Accordingly, write control transistor 48 is turned on, causing match transistor 44 to turn off, and write control transistor 50 is turned off, causing match transistor 46 to conduct. Once the data is written, W is deasserted, i.e., a low is provided to the W input line, which causes write control transistors 48, 50 to shut off, thus causing match transistors 44, 46 to remain in their respective state.

In an upper limit memory element 18, when a low is stored and a MATCH 1 operation is performed, i.e., a high is provided to the X input terminal of memory element 18 and a low is provided to the Y input terminal of element 18. Because match transistor 44 is off, when a low is provided to X, match transistor 44 is turned off, thus causing the charge provided on load transistor 40 to remain high, thereby providing a high input, the L' signal, to NAND gate 24. Additionally, assuming that line M is precharged, write control transistor 50 is off, current flows from the drain terminal to the source terminal in match transistor 46 thus causing G' to go low and load transistor 42 to conduct. Accordingly, M goes low.

In an upper limit memory element 18, when a low is stored and a MATCH 0 operation is performed, i.e., a low is provided to the X input line, and a high is provided to the Y input line of element, 18, because match transistor 44 is off, the low provided at the X input terminal causes match transistor 44 to remain off and the charge on the M line provides a high output signal at the L' output terminal. Additionally, because match transistor 46 is conducting, when a high is provided to the Y input terminal, match transistor 46 remains on and a high, the G' output signal, is provided to NAND gate 26. Because both the L' and G' lines are high, the M line remains high. With an upper limit memory element, M equals MATCH U; accordingly, MATCH U is low when any of the memory elements provides a low output to M.

Referring now to the WRITE 1 portion of FIG. 5, a WRITE 1 operation will first be described followed by descriptions of a MATCH 0 operation, a MATCH 1 operation and a MATCH X operation.

The WRITE 1 portion of FIG. 5 describes the operation to store a high in element 18. For a WRITE 1, a low is provided on the X input terminal, a high is provided on the Y input terminal and a high is provided on the, W input line. Accordingly, write control transistor 50 is turned on causing match transistor 46 to turn off, and write control transistor 48 is turned off, causing match transistor 44 to conduct. Once the data is written, W is deasserted, which causes write control transistors 48, 50 to go off, thus causing match transistors 44, 46 to remain in their respective states.

In an upper limit memory element 18, when a high is stored and a MATCH 0 operation is performed (i.e., a low is provided to the X input terminal of memory element 18 and a high is provided to the Y input terminal), because match transistor 46 is off and write control transistor 50 is on, when a high is provided to the Y input, match transistor 46 is turned off, thus providing a high input, the G' signal, to NAND gate 26. Additionally, because match transistor 44 is on, current flows from the drain terminal to the source terminal in match transistor 44, thus causing the L' output signal to go low and load transistor 40 to conduct. Accordingly, M goes low.

In an upper limit memory element 18, when a high is stored and when a MATCH 1 operation is performed (i.e., a high is provided to the X input of memory element 18 and a low is provided to the Y input), because match transistor 44 is conducting, load transistor 40 is high and write control transistor 48 is off, when a high is provided to the X input terminal, match transistor 44 remains high and a high, the L' output signal, is provided to NAND gate 24. Because match transistor 46 is off and match line M is high, when a high is provided at the Y input, match transistor 46 remains off and the charge on match line M provides a high output, the G' output signal, to NAND gate 26 through load transistor 42. Because both match transistors are off and line M is precharged, the M output line, which indicates a match, remains high. Additionally, because both L' and G', which are provided to NAND gates 24 26, respectively, are high, $Z_1$ is determined by $Z_0$.

Referring now to the WRITE X portion of FIG. 5, a WRITE X operation will be described.

The WRITE X portion of FIG. 5 describes the operation to store a "don't care" (i.e., a=b=0) in element 18. For a WRITE X, a low is provided to both the X and Y input terminals and a high is provided to the W input line. Accordingly, write control 48, 50 are turned on, causing match transistors 44, 46 to turn off due to the lows provided on input terminals X and Y. Once the data is written, W is deasserted, which causes write control transistors 48, 50 to shut off, thus causing match transistors 44, 46 to remain off.

In an upper limit memory element 18, when a don't care is stored, $Z_1$ provides an output which is dependent upon $Z_0$ for any input because element 18 indicates a match no matter what the input.

Referring to FIG. 6, in upper limit memory element 18, if $Z_0$ is high, indicating that the less significant bits of input word A are less than or equal to the corresponding less significant bits of upper bound U, then the present input word A bit equaling the present upper bound U bit would not change this fact. If $Z_0$ is low, indicating that the less significant bits of input word A are greater than the corresponding less significant bits of upper bound U, the present input word A bit equaling the present upper bound U bit would not change this fact and $Z_1$ would be low to indicate this condition.

Lower threshold memory elements 30 function the same as upper threshold memory elements 18 with the exception that the L' and G' outputs, which are provided to NAND gates 36, 38 respectively, are reversed. By reversing the L' and G' output signals, each lower threshold memory element provides an output signal which indicates whether a bit of input word A is greater than or equal to a corresponding bit of lower bound L.

More specifically, referring to FIG. 7, if a bit of input word A is less than the respective bit of lower bound L then $Z_1$ is low (indicating that, as of this memory element, input word A is less than lower bound L) regardless of what $Z_0$ equals because a more significant bit of a word takes priority over the conditions of the less significant bits. Likewise, if a bit of input word A is greater than the respective bit of lower bound L, then $Z_1$ is high (indicating that, as of this memory element, input word A is greater than or equal to lower bound L). However, when a bit of input word A equals the respective bit of lower bound L, $Z_1$ equals $Z_0$ because the present input word A bit equaling the present lower bound L bit does not change the condition determined by the less significant bits.

The operation of comparison circuit 10 will now be described with reference to FIGS. 1-3. The operation of upper threshold chain 12 is described by FIG. 2. More specifically, when the most significant bit of input word A ($A_{n-1}$) *is greater than the most significant bit of upper bound U ($U_{n-1}$) then a low is provided to NAND gate 24 (n−1)* and a high is provided to NAND gate 26 (n−1) (See FIG. 6). Accordingly, NAND gate 24(N−1) provides a high regardless of the valve of the output of NAND gate 26 (n−2) and NAND gate 26 (n−1) provides a low output signal. The limit threshold $A \leq U$ is low which indicates that input word A is greater than upper bound U. When input word bit $A_{n-1}$ is less than upper bound bit $U_{n-1}$, then limit threshold $A \leq U$ is high, which indicates that input word A is less than or equal to upper bound U. When input word bit $A_{n-1}$ equals upper bound bit $U_{n-1}$ then limit threshold $A \leq U$ is determined by the next less significant bit comparison. i.e., if $A_{n-2}$ is greater than $U_{n-2}$, then limit threshold $A \leq U$ is low and if $A_{n-2}$ is less than $U_{n-2}$, then limit threshold $A \leq L$ is high. If $A_{n-2}$ equals $U_{n-2}$, then limit threshold $A \leq U$ is determined by the next less significant bit and so on.

The operation of lower threshold chain 14 is described by FIG. 3. More specifically, when the most significant bit of input word A ($A_{n-1}$) is less than the most significant bit of lower bound L ($L_{n-1}$) then the limit threshold $A \geq L$ is low which indicates that input word A is less than upper bound U. When input word bit $A_{n-1}$ is greater than lower bound bit $L_{n-1}$, then limit threshold $A \geq L$ is high, which indicates that input word A is greater than or equal to lower bound L. When input word bit An−1 equals lower bound bit $U_{n-1}$ then limit threshold $A \geq L$ is determined by the next less significant bit comparison. i.e., if $A_{n-2}$ is less than $L_{n-2}$, then limit threshold $A \geq L$ is low and if $A_{n-2}$ is greater than $U_{n-2}$, then limit threshold $A \geq$ is high. If An−2 equals Un−2, then limit threshold $A \geq L$ is determined by the next less significant bit, and soon.

AND gate 16 receives limit threshold $A \leq U$ and limit threshold $A \geq L$ and provides a between limits window output signal which, when high, indicates that input word A is between upper bound U and lower bound L. This output is high when both limit threshold $A \leq U$ and limit threshold $A \geq L$ are high. If either of these thresholds is low, then the window output signal is also low.

I claim:

1. A comparison element comprising:

first and second inputs;

first and second pass transistors connected to the first and second inputs, respectively, and to provide first and second outputs, respectively;

first and second cross-over transistors connected to said first and second pass transistors, respectively, said first and second cross-over transistors being connected to said second and first inputs, respectively;

said pass transistors and said cross-over transistors being configured to store data at the junctions between said pass transistors and said cross-over transistors as received from the second and first inputs by the first and second cross-over transistors respectively, said first and second pass transistors being configured to compare stored data and comparison data presented on the first and second inputs, respectively, after the stored data, and to indicate, on one output, whether the comparison data is not less than the stored data and, on the other output, whether the comparison data is not greater than the stored data; and first and second diode means, connected to said first and second outputs respectively, said first and second diode means also being connected to a third output and being configured to indicate whether the comparison data matches the stored data, said first and second diode means individually isolating said first and second outputs from said third output.

2. The comparison element of claim 1, wherein said diode means are effected by transistors configured as diodes.

3. The comparison element of claim 1, further comprising logic elements coupled to receive the first and second outputs and configured to provide a fourth output to indicate either whether the comparison data is greater than the stored data or whether the comparison data is less than the stored data.

4. The comparison element of claim 3, wherein the logic elements include an inverter means connected to invert one of the first and second outputs and a NAND circuit connected to receive the other of the first and second outputs and the inverted one output.

5. A comparison circuit comprising
a plurality of comparison elements, each comparison element being configured to provide an output indicating whether an input is not greater than stored data, and output indicating whether an input is not less than stored data, and an output indicating whether an input is equal to stored data,
said plurality of comparison elements being arranged in an upper threshold chain and a lower threshold chain,
said outputs indicating whether an input is equal to stored data of said comparison elements of said upper threshold chain, being connected to provide an output indicating whether said input data is equal to an upper limit,
said outputs indicating whether an input is equal to stored data of said comparison elements of said lower threshold chain, being connected to provide an output indicating whether said input data is equal to a lower limit,
an upper limit circuit configured to receive said outputs indicating whether an input is not greater than and whether an input is not less than, of said upper threshold chain and to provide an upper limit output indicating whether an input word is less than said stored upper limit,
a lower limit circuit configured to receive said outputs indicating whether an input is not greater than and whether said input is not less than, of said lower threshold chain and to provide a lower limit output indicating whether an input word is greater than said stored lower limit, and
a window circuit configured to receive said upper limit output and said lower limit output and to provide a window output indicating whether said input is within said stored upper limit and said stored lower limit.

6. A circuit for determining predetermined relationships between a stored digital data word and an input data word comprising:
A. a first word storage device comprising a series of stages each including a memory element that stores a digital data bit, the bits stored in the series of stages defining the stored digital data word, and a comparator responsive to the stored digital data bit and an input digital data bit, the input digital data bits received by the comparators of the series of stages defining the input data word, the comparator transmitting through respective output terminals signals indicating selected value relationships between the values of the stored digital data bit and the input digital signal; and
B. a first logic chain connected to said output terminals that generates a signal indicating selected value relationships between the stored digital data word and the input digital data word,
C. a second word storage device for transmitting, through respective output terminals, signals indicating the relationship between the values of stored digital data bits comprising a stored digital data word and input data bits comprising the input data word,
D. a second logic chain connected to said second word storage device for generating a signal indicating the relationship of the digital data bits stored in said second word storage device and said input data word; and
E. a circuit for generating a consolidated output signal in response to signals from said logic chains to determine selected relationships between the digital data words stored in said word storage device and said input data word.

7. A circuit as defined in claim 6 in which said second word storage device comprises a series of stages each including a memory element that stores a digital data bit, the bits stored in the series of stages defining the stored digital data word, and a comparator responsive to the stored digital data bit and an input digital data bit, the input digital data bits received by the comparators of the series of stages defining the input data word, the comparator transmitting through respective output terminals signals indicating selected value relationships between the values of the stored digital data bit and the input digital signal.

8. A circuit as defined in claim 7 in which said comparator of said second word storage device comprises a transistor having a control connection comprising said memory element and other connections connected to receive an input signal representing said input digital data bit and to an output terminal, said transistor controlling the coupling of said input signal to the output terminal.

9. A circuit as defined in claim 8 further comprising a store enabling circuit for enabling the storage of a digital data word in the memory elements comprising said second word storage device.

10. A circuit as defined in claim 9 in which said store enabling circuit comprises a series of gates, each associated with a memory element, each facilitating the storage of a digital data bit in the associated memory element in response to a store enabling signal.

11. A circuit as defined in claim 10 in which said each said comparator comprises a transistor having a control connection comprising said memory element, each said gate being connected to the control connection of said respective transistor for facilitating the storage of the digital data bit at said control connection.

* * * * *